(12) United States Patent
Obayashi

(10) Patent No.: US 10,084,452 B2
(45) Date of Patent: Sep. 25, 2018

(54) INFORMATION PROCESSING APPARATUS, IMAGE PROCESSING APPARATUS WITH INFORMATION PROCESSING APPARATUS, AND CONTROL METHOD FOR INFORMATION PROCESSING APPARATUS

(71) Applicant: CANON KABUSHIKI KAISHA, Tokyo (JP)

(72) Inventor: Yosuke Obayashi, Nagareyama (JP)

(73) Assignee: Canon Kabushiki Kaisha, Tokyo (JP)

( * ) Notice: Subject to any disclaimer, the term of this patent is extended or adjusted under 35 U.S.C. 154(b) by 175 days.

(21) Appl. No.: 14/941,430

(22) Filed: Nov. 13, 2015

(65) Prior Publication Data

US 2016/0154602 A1 Jun. 2, 2016

(30) Foreign Application Priority Data

Nov. 28, 2014 (JP) .................................. 2014-241316

(51) Int. Cl.
    *H03K 19/177* (2006.01)
(52) U.S. Cl.
    CPC . *H03K 19/17756* (2013.01); *H03K 19/17776* (2013.01)
(58) Field of Classification Search
    CPC ................... H03K 19/17756; H03K 19/17776
    See application file for complete search history.

(56) References Cited

U.S. PATENT DOCUMENTS

| 8,786,310 | B1 * | 7/2014 | Lu ............................. | G06F 7/38 |
| | | | | 326/38 |
| 2002/0157071 | A1 * | 10/2002 | Schiefele ............ | G06F 11/1497 |
| | | | | 326/11 |
| 2008/0028187 | A1 * | 1/2008 | Casselman ............ | G06F 13/409 |
| | | | | 712/37 |
| 2011/0225415 | A1 * | 9/2011 | Yamada ........... | H03K 19/17752 |
| | | | | 713/100 |

FOREIGN PATENT DOCUMENTS

JP    2001-320271 A    11/2001
JP    2012-234337 A    11/2012

* cited by examiner

*Primary Examiner* — Aracelis Ruiz
(74) *Attorney, Agent, or Firm* — Canon U.S.A., Inc. IP Division

(57) ABSTRACT

An information processing apparatus includes a first storage unit to store a plurality of pieces of circuit configuration information corresponding to the respective plurality of partial reconfiguration portions, preloads a piece of circuit configuration information corresponding to one of the partial reconfiguration portions into a second storage unit having an access speed higher than an access speed of the first storage unit, and based on an operation status of the one partial reconfiguration portion, configures a logic circuit in the one partial reconfiguration portion, using the piece of circuit configuration information corresponding to the one partial reconfiguration portion that has been preloaded into the second storage unit, or configures a logic circuit in a partial reconfiguration portion different from the one partial reconfiguration portion, using a piece of circuit configuration information corresponding to the different partial reconfiguration portion that has been stored in the first storage unit.

11 Claims, 9 Drawing Sheets

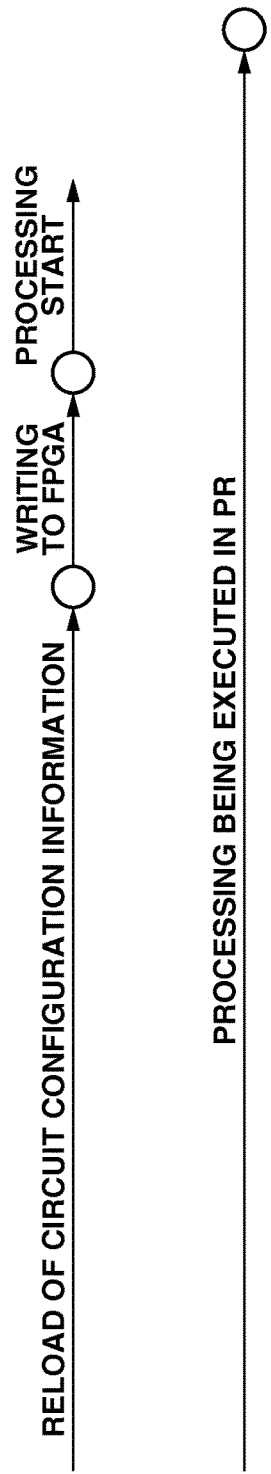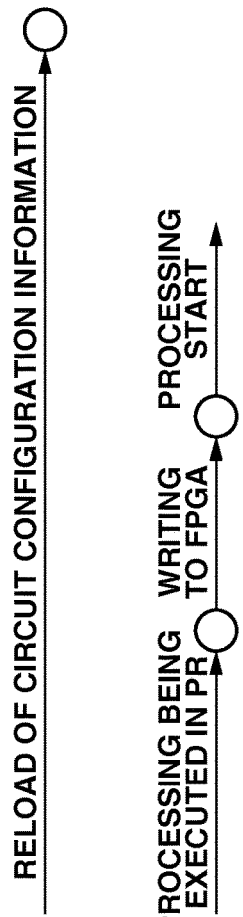

| PARTIAL RECONFIGURATION AREA | STATUS | JOB TYPE | PROCESSING CAPABILITY [n/s] α | PROCESSING DATA AMOUNT [n] A | ELAPSED TIME AFTER START [s] B | COMPLETION ESTIMATION TIME [s] A/α - B |
|---|---|---|---|---|---|---|
| PR1 | USED | PRINT | 4 | 100 | 10 | 15 |
| PR2 | USED | EXPANSION I/F PROCESSING | 1 | 6 | 4 | 2 |
| PR3 | UNUSED | — | — | — | — | — |
| PR4 | UNUSED | — | — | — | — | — |

702

| PARTIAL RECONFIGURATION AREA | RELOAD ESTIMATION TIME [s] |
|---|---|
| PR1 | 10 |
| PR2 | 8 |
| PR3 | — |
| PR4 | — |

INFORMATION PROCESSING APPARATUS, IMAGE PROCESSING APPARATUS WITH INFORMATION PROCESSING APPARATUS, AND CONTROL METHOD FOR INFORMATION PROCESSING APPARATUS

BACKGROUND OF THE INVENTION

Field of the Invention

The present invention relates to an information processing apparatus having a dynamically partially reconfigurable circuit, and a control method for the information processing apparatus.

Description of the Related Art

Reconfigurable circuits are widely known, including a programmable logic device (PLD) and a field programmable gate array (FPGA), both allowing configurations of internal logic circuits to be changed. In general, the PLD and the FPGA each perform switching of internal logic blocks, by writing circuit configuration information stored in a nonvolatile memory such as a read only memory (ROM) to a configuration memory, i.e., an internal volatile memory, upon activation. Information stored in the configuration memory is cleared at the time of power-off, and therefore, it is necessary to perform reconfiguration by writing the circuit configuration information to the configuration memory again, at the time of power-on. A method for thus configuring hardware resources only once is referred to as static reconfiguration. On the other hand, devices capable of changing circuit configurations during circuit operation have also been developed, and a method for changing a logic circuit during operation is referred to as dynamic reconfiguration.

One type of FPGAs allows rewriting of only a specific area, not the entire chip, and such rewriting is referred to as partial reconfiguration. In particular, performing partial reconfiguration without stopping other circuits in operation is referred to as dynamic partial reconfiguration. In the dynamic partial reconfiguration, partial reconfiguration of logic blocks inside the FPGA can be implemented by rewriting only a part of a configuration memory area, instead of rewriting the entire configuration memory at the time of dynamic reconfiguration.

Using such a dynamic partial reconfiguration technique, circuits can be implemented in one area by switching from one to another. Therefore, it is possible to change a function implemented by a logic block, by performing time-division multiplexing of hardware resources. As a result, various functions can be flexibly implemented with small hardware resources according to a purpose while high computing performance by hardware is maintained. In Japanese Patent Application Laid-Open No. 2001-320271, this dynamic partial reconfiguration is used, so that a function can be implemented by rewriting only some of logic circuits in a FPGA. Therefore, the time taken for reconfiguration can be reduced, as compared with a conventional technique with which the entire FPGA is reconfigured.

Other techniques for reducing the time taken for reconfiguration of logic circuits are also discussed. Japanese Patent Application Laid-Open No. 2012-234337 discusses a technique for predicting processing highly likely to be executed next, during image processing. In this technique, configuration data (hereinafter referred to as "circuit configuration information") for implementing the predicted processing is transferred beforehand to a high-speed memory. This is referred to as preload. The preload can reduce the time for transferring the circuit configuration information during the image processing, and thereby enhance the speed of the image processing.

Combining the partial reconfiguration technique with the preload technique can greatly reduce the time taken for reconfiguration, as compared with the conventional FPGA reconfiguration. Therefore, time-division multiplexing with further segmentation can be achieved.

However, segmenting a functional unit leads to an increase in the number of pieces of necessary circuit configuration information. As a result, a miss-hit rate of the preloaded circuit configuration information increases. The miss-hit described here is a case where necessary circuit configuration information is not transferred, or transferred circuit configuration information for a specific partial reconfiguration portion is not available because the relevant area is being used.

The increase in the miss-hit rate of the preloaded circuit configuration information leads to degradation of the efficiency of the image processing.

As described above, in a configuration using a partially reconfigurable circuit while partially reconfiguring the circuit, if circuit configuration information recorded in an information holding unit cannot be used, efficiency decreases, which is a problem.

For example, assume that processing of a certain function is desired to be started. Although circuit configuration information for a specific partial reconfiguration portion of the function is preloaded (transferred), the relevant area may be being used for other processing. In this situation, the relevant area cannot be reconfigured and therefore, processing stops. In this way, even if circuit configuration information for processing of a function is already transferred, the miss-hit may occur depending on for which partial reconfiguration portion the circuit configuration information for the processing of the function is provided.

SUMMARY OF THE INVENTION

An exemplary embodiment of the present invention to be described below defines a processing flow to be performed when a miss-hit of already-transferred circuit configuration information occurs, in an image processing apparatus capable of performing dynamic partial reconfiguration. This allows execution of control for suppressing efficiency degradation as much as possible, even if the miss-hit occurs.

According to an aspect of the present invention, an information processing apparatus includes a partially reconfigurable circuit including a plurality of partial reconfiguration portions, a first storage unit configured to store a plurality of pieces of circuit configuration information corresponding to the respective plurality of partial reconfiguration portions, a preload unit configured to preload a piece of circuit configuration information corresponding to one partial reconfiguration portion among the plurality of partial reconfiguration portions into a second storage unit having an access speed higher than an access speed of the first storage unit, and a control unit configured to, based on an operation status of the one partial reconfiguration portion, configure a logic circuit in the one partial reconfiguration portion, using the piece of circuit configuration information corresponding to the one partial reconfiguration portion that has been preloaded into the second storage unit, or configure a logic circuit in a partial reconfiguration portion different from the one partial reconfiguration portion, using a piece of circuit configuration information corresponding to the different partial reconfiguration portion that has been stored in the first storage unit.

Further features of the present invention will become apparent from the following description of exemplary embodiments with reference to the attached drawings.

BRIEF DESCRIPTION OF THE DRAWINGS

FIGS. 6A and 6B are timing charts each illustrating an effect of the function execution processing control.

FIG. 7 is a diagram illustrating a table for time estimation according to a second exemplary embodiment of the present invention.

DESCRIPTION OF THE EMBODIMENTS

Exemplary embodiments of the present invention will be described below with reference to the drawings. An image processing apparatus will be described below as each of the exemplary embodiments. However, any type of information processing apparatus may be adopted as long as the information processing apparatus can perform partial reconfiguration control in the scope not deviating from technical ideas of the present invention.

[Configuration of Image Processing Apparatus]

Figure 1:
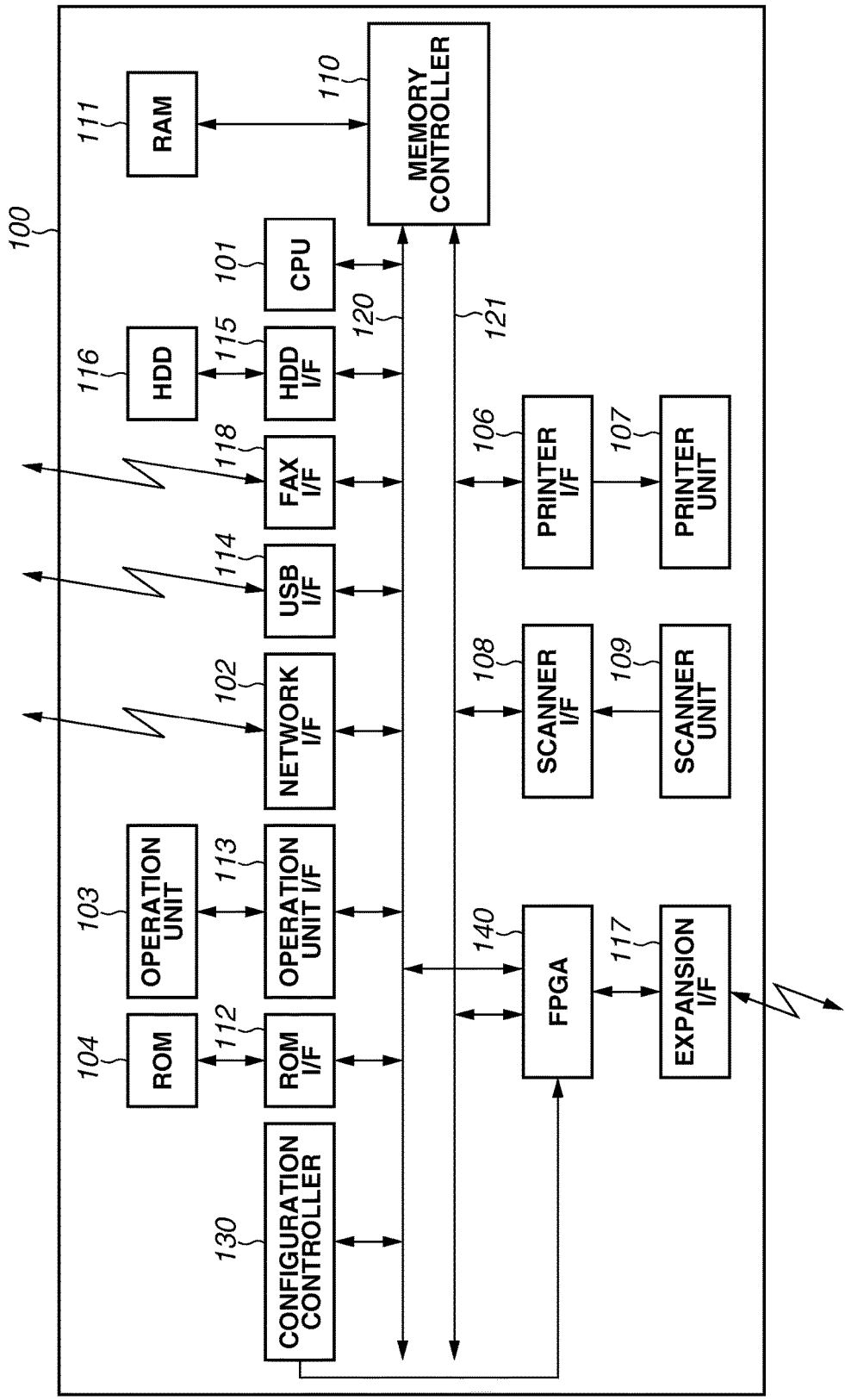
FIG. 1 is a block diagram illustrating a configuration of an image processing apparatus according to an exemplary embodiment of the present invention.

A first exemplary embodiment will be described below. FIG. 1 is a block diagram illustrating a configuration of an image processing apparatus according to the present exemplary embodiment. An image processing apparatus 100 according to the present exemplary embodiment includes an operation unit 103 on which a user using the image processing apparatus 100 performs various kinds of operation, a scanner unit 109 provided to read image information according to an instruction from the operation unit 103, and a printer unit 107 provided to print image data on paper. The scanner unit 109 includes a central processing unit (CPU) (not illustrated) provided to control the scanner unit 109, and further includes an illumination lamp and a scanning mirror (neither illustrated) for document reading. The printer unit 107 includes a CPU (not illustrated) provided to control the printer unit 107, and further includes a photosensitive drum for image forming and a fixing unit for fixing (neither illustrated).

The image processing apparatus 100 further includes a CPU 101 provided to comprehensively control operations of the image processing apparatus 100, to execute control software for controlling each unit of the image processing apparatus 100. The image processing apparatus 100 further includes a read only memory (ROM) 104 storing a program to be executed by the CPU 101. The image processing apparatus 100 further includes a hard disk drive (HDD) 116 for spooling image processing data, and storing all pieces of circuit configuration information that are used in the image processing apparatus 100.

The image processing apparatus 100 further includes a random access memory (RAM) 111, which is a system work memory for operations of the CPU 101, and is also an image memory for temporarily storing image data. The RAM 111 also serves an information holding unit for temporarily holding circuit configuration information. The circuit configuration information is copied beforehand from the HDD 116 with low access speed to the RAM 111 with high access speed and temporarily held in the RAM 111, so that the circuit configuration information can be read from the RAM 111 at high speed. This method will be referred as "preload". The high-speed memory used for the preload is not limited to the RAM 111 serving as the system work memory. Other types of preload memory include a RAM in a field programmable gate array (FPGA), and a dedicated preload memory having a plurality of banks used for a dynamic reconfigurable processor (DRP) or the like. The image processing apparatus 100 further includes a memory controller 110 provided to control the RAM 111 as well as operations for writing to and reading from the RAM 111. The memory controller 110 is connected to a system bus 120 and an image bus 121 to control access to the RAM 111.

The image processing apparatus 100 has a FPGA 140 forming an image processing circuit serving as a reconfigurable circuit device. In the present exemplary embodiment, the FPGA is described as an example of the reconfigurable circuit device. However, a configuration where a reconfigurable circuit device other than the FPGA is connected may be adopted. The image processing apparatus 100 further includes a configuration controller 130 provided to control a circuit configuration (configuration) of the FPGA 140 under the control of the CPU 101.

The FPGA 140 is dynamically rewritable, as well as partially rewritable. In other words, while a circuit forming a part of a reconfiguration portion of the FPGA 140 is in operation, another circuit can be reconfigured in a part not overlapping the part occupied by the circuit.

The image processing apparatus 100 further includes a scanner interface (I/F) 108 provided to receive image data input from the scanner unit 109, and a printer I/F 106 provided to output image data to the printer unit 107. The FPGA 140, the scanner I/F 108, and the printer I/F 106 are connected to the image bus 121 for transferring image data to be processed.

In addition, the image processing apparatus 100 performs communication (transmission and reception) with a general-purpose computer (not illustrated) on a network via a network I/F 102. The image processing apparatus 100 also performs communication (transmission and reception) with a general-purpose computer (not illustrated) connected to the image processing apparatus 100 via a Universal Serial Bus (USB) I/F 114. The image processing apparatus 100 also performs communication (transmission and reception) with another image processing apparatus and a facsimile apparatus (neither illustrated), when being connected to a public line, via a fax I/F 118. The image processing apparatus 100 further includes a ROM I/F 112 provided to control the program executed by the CPU 101 as well as operations for writing to and reading from the ROM 104. The image processing apparatus 100 further includes the system bus 120 provided to interconnect the CPU 101, the network I/F 102, the operation unit 103, the ROM I/F 112, the USB I/F 114, an HDD I/F 115, the fax I/F 118, the configuration controller 130, and the FPGA 140. The CPU 101 performs parameter setting for the FPGA 140, the scanner I/F 108, and the printer I/F 106, via the system bus 120.

The image processing apparatus 100 further includes an expansion I/F 117 connected to the FPGA 140, to add an expansion module such as a sensor (not illustrated). Although, in the present exemplary embodiment, the circuit configuration information is stored in the HDD 116, such a storage location is not limited to the inside of the image processing apparatus 100. For example, the circuit configuration information may be downloaded whenever necessary from an external server via a network.

[Configuration Related to Partial Reconfiguration]

Figure 2:
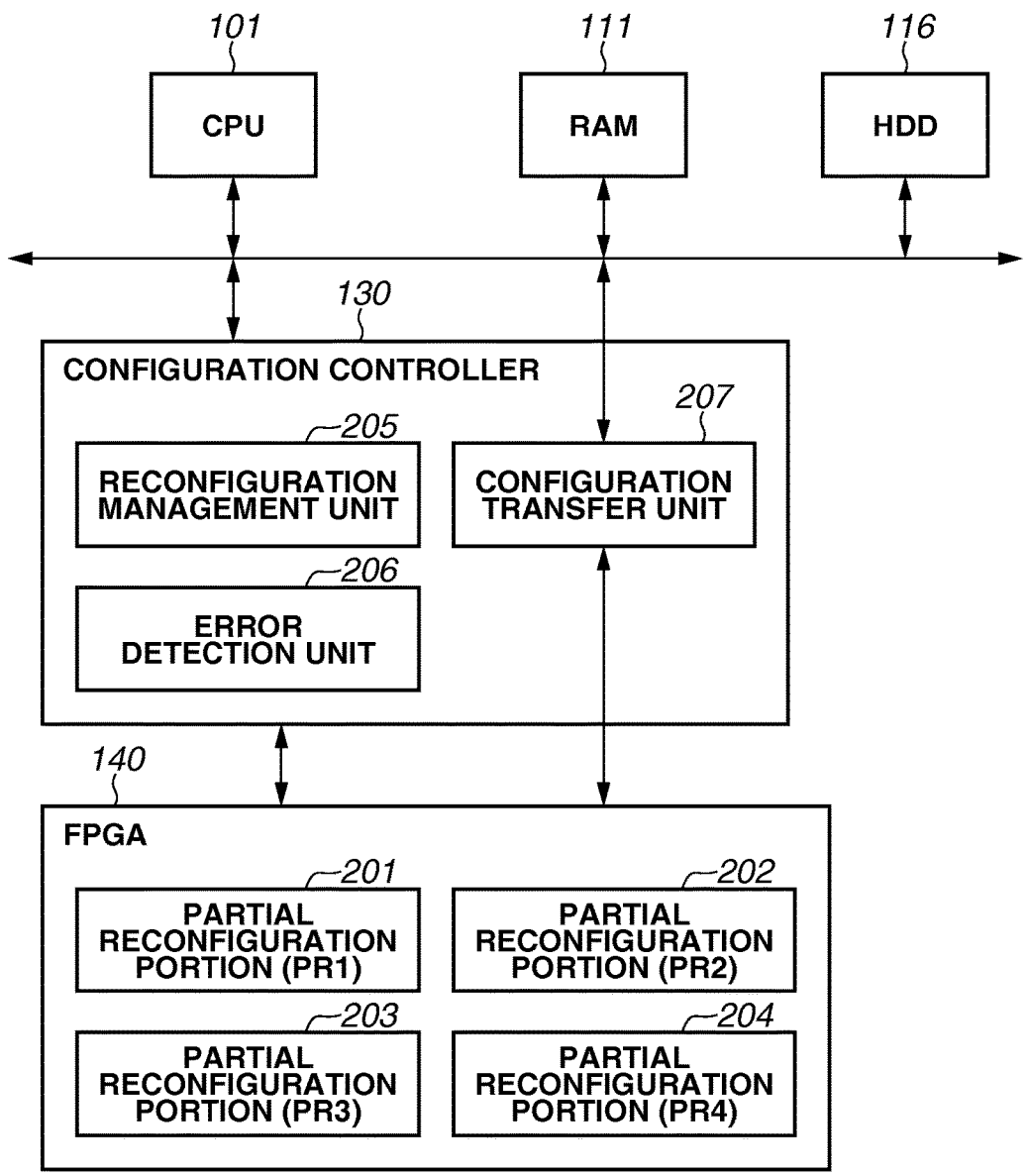
FIG. 2 is a block diagram illustrating a configuration related to dynamic partial reconfiguration.

Next, a configuration related to partial reconfiguration in the image processing apparatus 100 according to the present exemplary embodiment will be described using FIG. 2. FIG. 2 is a block diagram illustrating a configuration particularly related to the partial reconfiguration of the image processing apparatus 100. The CPU 101, the configuration controller 130, the RAM 111, the HDD 116, and the FPGA 140 are described above using FIG. 1.

The FPGA 140 includes a partial reconfiguration portion 201 (PR1), a partial reconfiguration portion 202 (PR2), a partial reconfiguration portion 203 (PR3), and a partial reconfiguration portion 204 (PR4). Each of the partial reconfiguration portions 202 to 204 can dynamically rewrite an image processing circuit. In the present exemplary embodiment, an example of a configuration in which a circuit having an image processing function is configured in a partial reconfiguration portion is described. However, a circuit having a function other than the image processing function may be configured in a partial reconfiguration portion. For example, processing for a sensor connected to the expansion I/F 117 may be configured in a partial reconfiguration portion, so that a function can be implemented.

The configuration controller 130 includes a reconfiguration management unit 205 and an error detection unit 206. The reconfiguration management unit 205 has a function of managing partial reconfiguration of each of the partial reconfiguration portions 201, 202, 203, and 204. For example, the reconfiguration management unit 205 manages availability of each of the partial reconfiguration portions, such as whether each of the partial reconfiguration portions 201, 202, 203, and 204 is used for the current processing. Based on such management, the reconfiguration management unit 205 determines whether each of the partial reconfiguration portions is rewritable.

Considering such determination as to whether each of the partial reconfiguration portions is rewritable based on the information managed by the reconfiguration management unit 205, the CPU 101 provides an instruction for starting transfer of the circuit configuration information to a configuration transfer unit 207. Based on the instruction of the CPU 101, the configuration transfer unit 207 reads necessary circuit configuration information from the RAM 111 and writes the read circuit configuration information to each of the partial reconfiguration portions 201, 202, 203, and 204. Here, the circuit configuration information stored in the RAM 111 is assumed to have been copied from the HDD 116 and stored beforehand by the CPU 101.

The error detection unit 206 has a function of detecting an error when partial reconfiguration is not normally completed. For example, when rewriting of the partial reconfiguration portion 201 is performed, the error detection unit 206 monitors an error signal that is output by a reconfigurable circuit device at occurrence of a failure due to some factor. The error detection unit 206 has a function of providing a notification to the reconfiguration management unit 205, when detecting the error signal.

[Configuration of Circuit Configuration Information]

Figure 3:
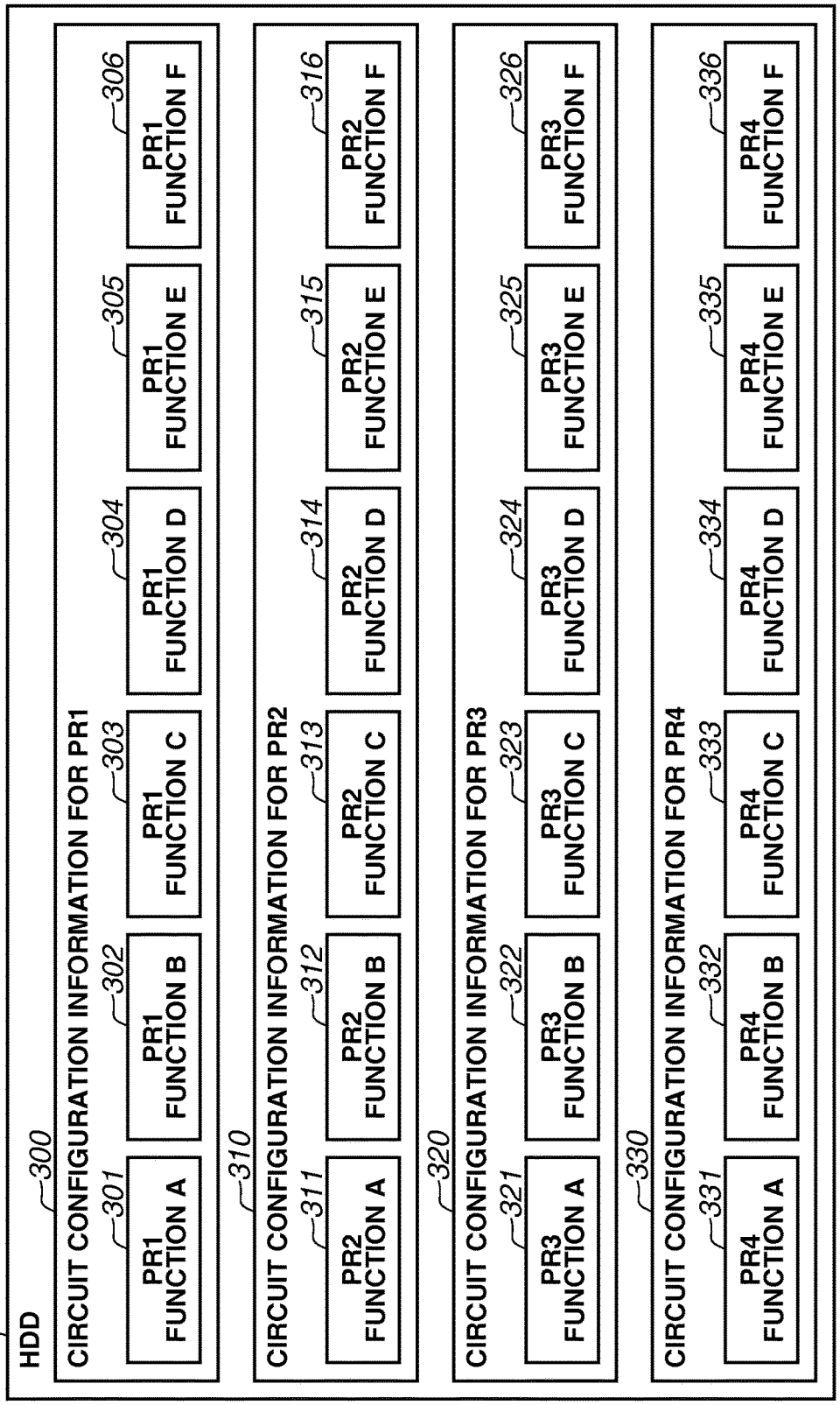
FIG. 3 is a diagram illustrating a method for storing circuit information to be configured in a reconfiguration portion.

Next, a method for storing the circuit configuration information to be configured in the partial reconfiguration portions 201 to 204 of the FPGA 140 in the image processing apparatus 100 according to the present exemplary embodiment will be described using FIG. 3. FIG. 3 is an example of the circuit configuration information stored in the HDD 116, to be configured in each of the partial reconfiguration portions 201 to 204 of the FPGA 140.

The HDD 116 stores pieces of circuit configuration information necessary for partial reconfiguration. Circuit configuration information 300 for the PR1 represents circuit configuration information that can be configured in the partial reconfiguration portion 201 (PR1). FIG. 3 illustrates, as an example, a case where six functions A, B, C, D, E, and F can be configured in the partial reconfiguration portion 201 (PR1). A PR1 function A 301 represents circuit configuration information for configuring a circuit of the function A in the PR1. Similarly, a PR1 function B 302 represents circuit configuration information for configuring a circuit of the function B in the PR1, a PR1 function C 303 represents circuit configuration information for configuring a circuit of the function C in the PR1, and a PR1 function D 304 presents circuit configuration information for configuring a circuit of the function D in the PR1. Similarly, a PR1 function E 305 represents circuit configuration information for configuring a circuit of the function C in the PR1, and a PR1 function F 306 represents circuit configuration information for configuring a circuit of the function F in the PR1.

Further, circuit configuration information 310 for the PR2 represents circuit configuration information that can be configured in the partial reconfiguration portion 202 (PR2). The circuit configuration information 310 for the PR2 also stores circuit configuration information for each of six functions A, B, C, D, E, and F, and any of the six functions can be configured in the partial reconfiguration portion 202 (PR2) by being switched from one to another.

Circuit configuration information 320 for the PR3 represents circuit configuration information that can be configured in the partial reconfiguration portion 203 (PR3). The circuit configuration information 320 for the PR3 also stores circuit configuration information for each of six functions A, B, C, D, E, and F, and any of the six functions can be configured in the partial reconfiguration portion 203 (PR3) by being switched from one to another.

Circuit configuration information 330 for the PR4 represents circuit configuration information that can be configured in the partial reconfiguration portion 204 (PR4). The circuit configuration information 330 for the PR4 also stores circuit configuration information for each of six functions A, B, C, D, E, and F, and any of the six functions can be configured in the partial reconfiguration portion 204 (PR4) by being switched from one to another.

As described above, it is necessary to prepare the circuit configuration information for each of the reconfiguration portions. For example, to configure the circuit of the function A in each of the partial reconfiguration portion 201 (PR1) and the partial reconfiguration portion 202 (PR2), the PR1 function A 301 and a PR2 function A 311 are necessary. In this way, even when the same function is to be implemented, it is necessary to prepare different pieces of circuit configuration information in the respective configuration locations. Therefore, when there are many pieces of circuit configuration information for the respective partial reconfiguration portions, each of the partial reconfiguration portions is flexibly usable. However, the volume of data stored in the HDD 116 is large.

In the present exemplary embodiment, as an example, the FPGA 140 is described to have the four partial reconfiguration portions, and the six functions A, B, C, D, E, and F are configured in each of the partial reconfiguration portions. Such partial reconfiguration areas and six functions to be configured in these areas are adopted only for easy understanding of the description, and the number of functions is not limited to six.

[Configuration of Preloaded Circuit Configuration Information]

Figure 4:
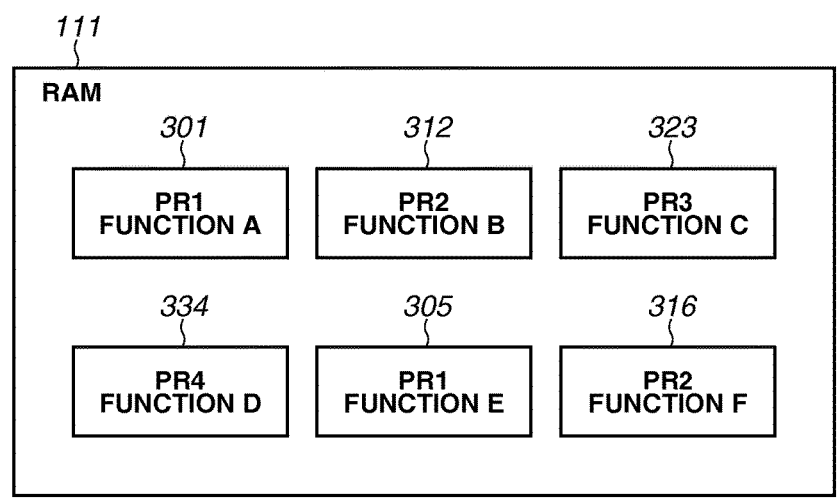
FIG. 4 is a diagram illustrating a method for storing circuit information into an information holding unit.

FIG. 4 is a diagram illustrating an example of circuit configuration information preloaded into the RAM 111.

As described above, if there are many pieces of circuit configuration information for the partial reconfiguration portions, the total volume of the circuit configuration information is large. In addition, the RAM 111 is also used as the system work memory and the memory for temporarily storing image data, and therefore, an area available for a preload of the circuit configuration information is limited to some extent. Even if a memory (e.g., a preload memory dedicated to Dynamic Reconfiguration Processor (DRP)) other than the RAM 111 is used as a preload memory, an area for the preload is similarly limited.

Therefore, not all pieces of circuit configuration information stored in the HDD 116 can be preloaded into the RAM 111. In the present exemplary embodiment, the number of pieces of circuit configuration information that can be preloaded into the RAM 111 is limited to six. For example, as illustrated in FIG. 4, pieces of circuit configuration information for the respective PR1, PR2, PR3, PR4, PR1, and PR2 are preloaded for the functions A, B, C, D, E, and F, respectively, into the RAM 111. In FIG. 4, for each of the PR1 function A 301 and the PR1 function E 305, the circuit configuration information for the same partial reconfiguration portion (PR1) is preloaded. Similarly, for each of a PR2 function B 312 and a PR2 function F 316, the circuit configuration information for the same partial reconfiguration portion (PR2) is preloaded.

In this way, if there are many pieces of circuit configuration information for the partial reconfiguration portions, preloading pieces of circuit configuration information for the same partial reconfiguration portion is inevitable due to limited capacity of the preload memory. Therefore, for example, when the pieces of circuit configuration information for the respective functions A to F have been preloaded, processing of the function A and processing of the function E overlap each other, and thereby a collision between the preloaded pieces of circuit configuration information occurs. This will be referred to as "preload miss-hit". The preload miss-hit refers to not only the situation described above, but also a situation where circuit configuration information for a certain function is not preloaded irrespective of the partial reconfiguration portion.

[Function Execution Processing Control Flow]

Figure 5:
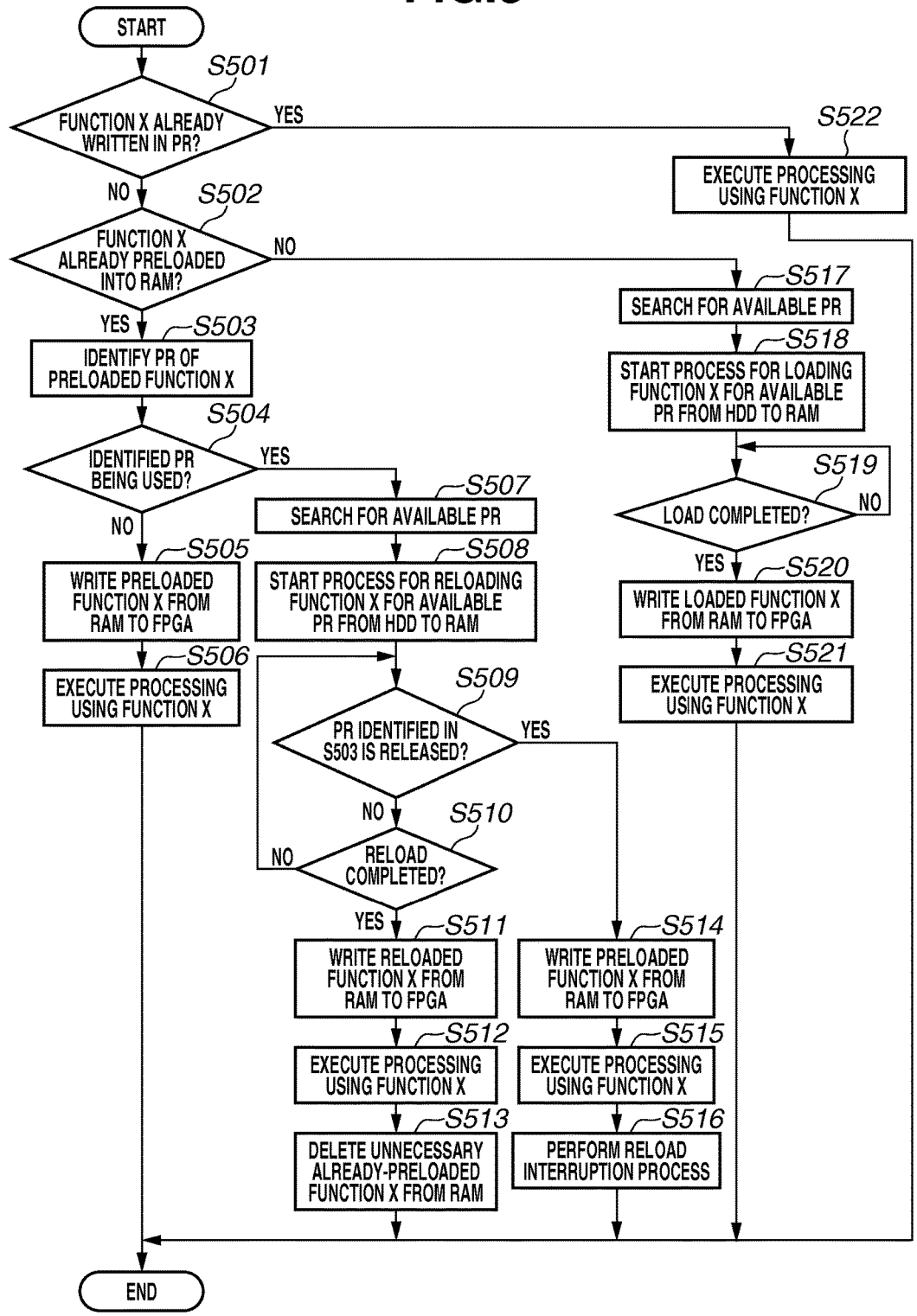
FIG. 5 is a flowchart concerning function execution processing control.

FIG. 5 is a flowchart illustrating function execution processing control of the image processing apparatus 100 according to the present exemplary embodiment. If a preload miss-hit occurs when it is desired to start processing of a certain function, the function cannot be started, which leads to degradation of efficiency. Processing for suppressing efficiency degradation as much as possible when a miss-hit occurs will be described in detail using FIG. 5.

The flowchart of FIG. 5 represents a processing flow performed in a case where a processing initiation request for a function X is made from the operation unit 103 or a general-purpose computer (not illustrated) connected to the network I/F 102. This flow is limited to neither a specific function X, nor the preloaded circuit configuration information illustrated in FIG. 4. The CPU 101 executes each procedure in the flowchart of FIG. 5.

First, in step S501, it is determined whether the function X has been written to the partial reconfiguration portions PR1 to PR4. If the function X is not present in any PR (NO in step S501), the operation proceeds to step S502. In step S502, it is determined whether the function X (the circuit configuration information of the function X) has been preloaded into the RAM 111. If the circuit configuration information of the function X has been preloaded (YES in step S502), the operation proceeds to step S503. In step S503, a PR of the FPGA 140 is identified, i.e., it is determined a PR for which the preloaded circuit configuration information of the function X is provided. In step S504, it is determined whether the PR identified in step S503 is currently used by other processing. When the PR is not used (NO in step S504), the operation proceeds to step S505. In step S505, the preloaded function X is written to the PR identified in step S503. In step S506, the processing is executed after necessary setting is performed for the function X written to the FPGA 140. If the PR identified in step S503 is used (YES in step S504), the operation proceeds to step S507.

In step S507, an available PR is searched for, among the partial reconfiguration portions PR1 to PR4. The available PR refers to a PR in which no circuit configuration information is written, or a PR in which a function is written but processing is terminated. If there is no available PR, the function X cannot be written, and therefore, the operation waits until an available PR is found. In step S508, the function X for the available PR found in step S507 is reloaded from the HDD 116 to the RAM 111. This reload refers to newly preloading the function X for another PR from the HDD 116 into the RAM 111, in a state where the function X has been preloaded. When the already-preloaded function X and the reloaded function X are for different PRs, the RAM 111 holds both pieces of circuit configuration information and performs no overwriting. In step S509, it is determined whether the PR identified in step S503, i.e., the PR to which the already-preloaded function X is writable, has been released. If the PR has not been released (NO in step S509), the operation proceeds to step S510. If the PR has been released (YES in step S509), the operation proceeds to step S514. In step S510, it is determined whether the reload started in step S508 is completed (load completion determination). If the reload is not completed (NO in step S510), the operation returns to step S509. If the reload is completed (YES in step S510), the operation proceeds to step S511.

In step S511, the function X reloaded into the RAM 111 is written to the PR found in step S507. In step S512, the processing is executed after necessary setting and is performed for the function X written to the FPGA 140. In step S513, the already-preloaded function X that is unnecessary is deleted from the RAM 111. In step S512, both the function X preloaded into the RAM 111 before start of processing and the function X reloaded in step S508 for the available PR have been loaded into the RAM 111. Preloading the function X for each of two or more partial reconfiguration portions is an overlap for one type of function, and leads to insufficient capacity of the RAM 111. Therefore, the unnecessary function X, i.e., the function X not written to the partial reconfiguration portion of the FPGA 140 is deleted.

In step S514, the function X preloaded beforehand into the RAM 111 is written to the PR identified in step S503. In step S515, the processing is executed after necessary setting and the like are performed for the function X written to the FPGA 140. In step S516, an interruption process for the reload started in step S508 is performed, to prevent the above-described overlapping preload of the function X into the RAM 111. In this control flow, such a reload interruption process is performed in step S516, but the timing for performing the interruption process is not limited to step S516. In a case where a reload start process in step S508 is executed in parallel with the process in FIG. 5 as another process in the CPU 101, the reload interruption process may be performed before step S514.

If the function X has not been preloaded (NO in step S502), the operation proceeds to step S517. In step S517, an available PR is searched for, among the partial reconfiguration portions PR1 to PR4, as in step S507. If there is no available PR (NO in step S517), it is not possible to determine a PR for which the function X can be used, and therefore, the operation waits until an available PR is found. In step S518, the function X for the available PR found in step S517 is loaded from the HDD 116 into the RAM 111. In step S519, the operation waits until such a load process started in step S518 is completed. If the load process is determined to be completed (YES in step S519), the operation proceeds to step S520. In step S520, the function X loaded into the RAM 111 in step S518 is written to the PR found in step S517. In step S521, the processing is executed after necessary setting is performed for the function X written to the FPGA 140. If the function X is determined to have been written to the PR (YES in step S501), the operation proceeds to step S522.

In step S522, the processing is executed after necessary setting is performed for the written function X. In this control flow, it is important to perform control for a case where a preload miss-hit occurs, in particular, for a case where processing cannot be started because a partial reconfiguration portion is used by other processing, even though circuit configuration information of a necessary function has been preloaded. In step S508 to step S510, the reload of the circuit configuration information for the available PR is executed in parallel with the waiting for release of the partial reconfiguration portion used by other processing. Therefore, it is possible to use the circuit configuration information of one of those, whichever is completed earlier, so that a waiting time can be reduced.

[Timing Chart Illustrating Effects]

FIGS. 6A and 6B are timing charts each illustrating an effect of the function execution processing control flow illustrated in FIG. 5, of the image processing apparatus 100 according to the exemplary embodiment. FIG. 6A illustrates a case where the reload is completed before completion of other processing. Specifically, FIG. 6A is a timing chart illustrating a case where, in step S508 to step S510, the reload of the circuit configuration information for the available PR is completed before completion of the other processing being executed in the PR identified in step S503. In this case, at the time of completion of the reload, writing to the FPGA 140 is performed using the reloaded circuit configuration information, so that the processing can be started. Therefore, it is possible to start the processing without waiting for completion of the other processing. The case illustrated in FIG. 6A is effective, when a processing time is extremely long, such as a case where a large amount of data is processed.

FIG. 6B illustrates a case where the other processing is completed before completion of the reload. As illustrated in FIG. 6B, as a matter of course, the other processing may be completed before completion of the reload, in step S508 to step S510. In this case, writing to the released PR is performed using the previously-preloaded circuit configuration information, so that the processing can be started. Therefore, it is possible to start the processing without waiting for completion of the reload process. The case illustrated in FIG. 6B is effective, when the other processing is completed in a short time, or when the reload takes a long time, in particular, when a load takes a long time such as a case where circuit configuration information is loaded via a network. By performing the above-described control, efficiency degradation can be suppressed as much as possible, even if a preload miss-hit occurs, in an image processing apparatus capable of performing dynamic partial reconfiguration.

A second exemplary embodiment will be described below. In the first exemplary embodiment, the control flow is described to execute the reload and the waiting for completion of the other processing in parallel, in a case where a preload miss-hit occurs, in particular, in a case where reconfiguration cannot be executed because a partial reconfiguration portion is used by other processing, even though circuit configuration information of a necessary function has been preloaded. In the second exemplary embodiment, a reload is not necessarily executed. In control executed in the second exemplary embodiment, a time to be taken for a reload and a time to completion of other processing are estimated, and the reload is not executed when the time to the completion of the other processing is earlier than the time to be taken for the reload. This is important to reduce a processing load of the CPU 101 for the reload, and to decrease memory space used by the CPU 101 for the reload. In particular, for example, in a case where it is necessary to download circuit configuration information whenever necessary from an external server connected via a network, authentication processing for the download is necessary, and therefore, a reduction in the processing load of the CPU 101 cannot be ignored. The control performed according to the second exemplary embodiment is particularly effective in such a case. The second exemplary embodiment will be described below with reference to the drawings, while focusing on a difference from the first exemplary embodiment.

[Table for Time Estimation]

FIG. 7 is a diagram illustrating a table for estimating a completion time for the processing executed in each of the partial reconfiguration portions (PR1 to PR4), and a reload time. A partial reconfiguration portion management table 701 manages and records a use status of each of the partial reconfiguration portions. A reload time estimation table 702 records a time estimated to be taken for a reload. The reload time estimation table 702 and the partial reconfiguration portion management table 701 are managed using the CPU 101.

The partial reconfiguration portion management table 701 records a job type, a processing capability [n/s] of a function X corresponding to the job type, a processing data amount [n], and an elapsed time [s] after start of processing, in a case where the partial reconfiguration portion is in use. For each PR, when the PR is in use, the CPU 101 can estimate a completion time, using the processing capability, the processing data amount, and the elapsed time after start in the partial reconfiguration portion management table 701. The completion time can be determined by (processing completion time=processing data amount/processing capability−elapsed time from start). FIG. 7 illustrates, as an example, a case where the partial reconfiguration portions PR1 and PR2 are used for a print job and expansion I/F processing, respectively, and the partial reconfiguration portions PR3 and PR4 are not in use. The print job is a job for printing print data sent from an external printer driver, using the printer unit 107. The expansion I/F processing is related to, for example, various sensors connected to the expansion I/F 117. The method for calculating the completion time in the present exemplary embodiment is only an example, and is not limited thereto.

Meanwhile, calculation of the processing data amount is difficult in some processing. For example, a SEND job corresponds to such processing. The SEND job is a job for transmitting image data corresponding to a document scanned by the scanner unit 109, to an external general-purpose computer (not illustrated), via the network I/F 102. In the SEND job, how any documents a user intends to feed for scanning may be unknown until the documents are actually scanned by the scanner unit 109. For this type of job, the completion time can be estimated by using a constant for the processing data amount in each job.

The reload time estimation table 702 records an estimation value of a time necessary for reloading the circuit configuration information into the RAM 111. Estimation of the reload time varies according to the method for acquiring the circuit configuration information. In a case where the circuit configuration information is transferred from the HDD 116 to the RAM 111, a logical value of the HDD I/F 115, such as Serial Advanced Technology Attachment (SATA), can be used. In a case where the circuit configuration information is transferred from a server to the RAM 111 via a network, estimation using a logical value is difficult, and therefore, the reload time can be estimated by a method such as use of an average value based on results in the past. When the PRs vary in size, pieces of necessary circuit configuration information also vary in size, and therefore, the reload estimation times of the respective PRs vary as well in some cases. In other cases, for the same PR, the circuit configuration information varies in size according to the function, and the reload estimation time varies depending on the function.

[Function Execution Control Flow Using Estimation Value]

Figure 8:
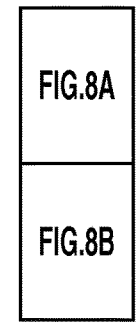
FIG. 8, consisting of FIGS. 8A and 8B, is a flowchart concerning function execution processing control.
Figure 8A:
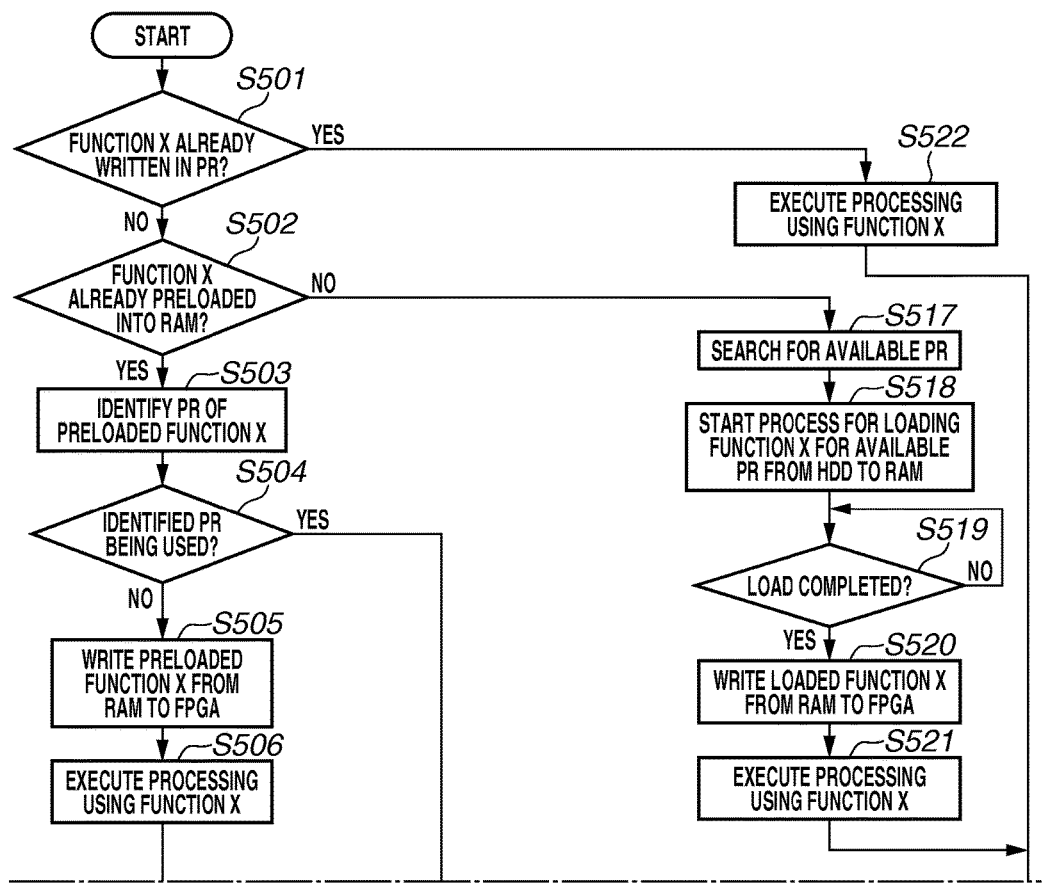
Figure 8B:
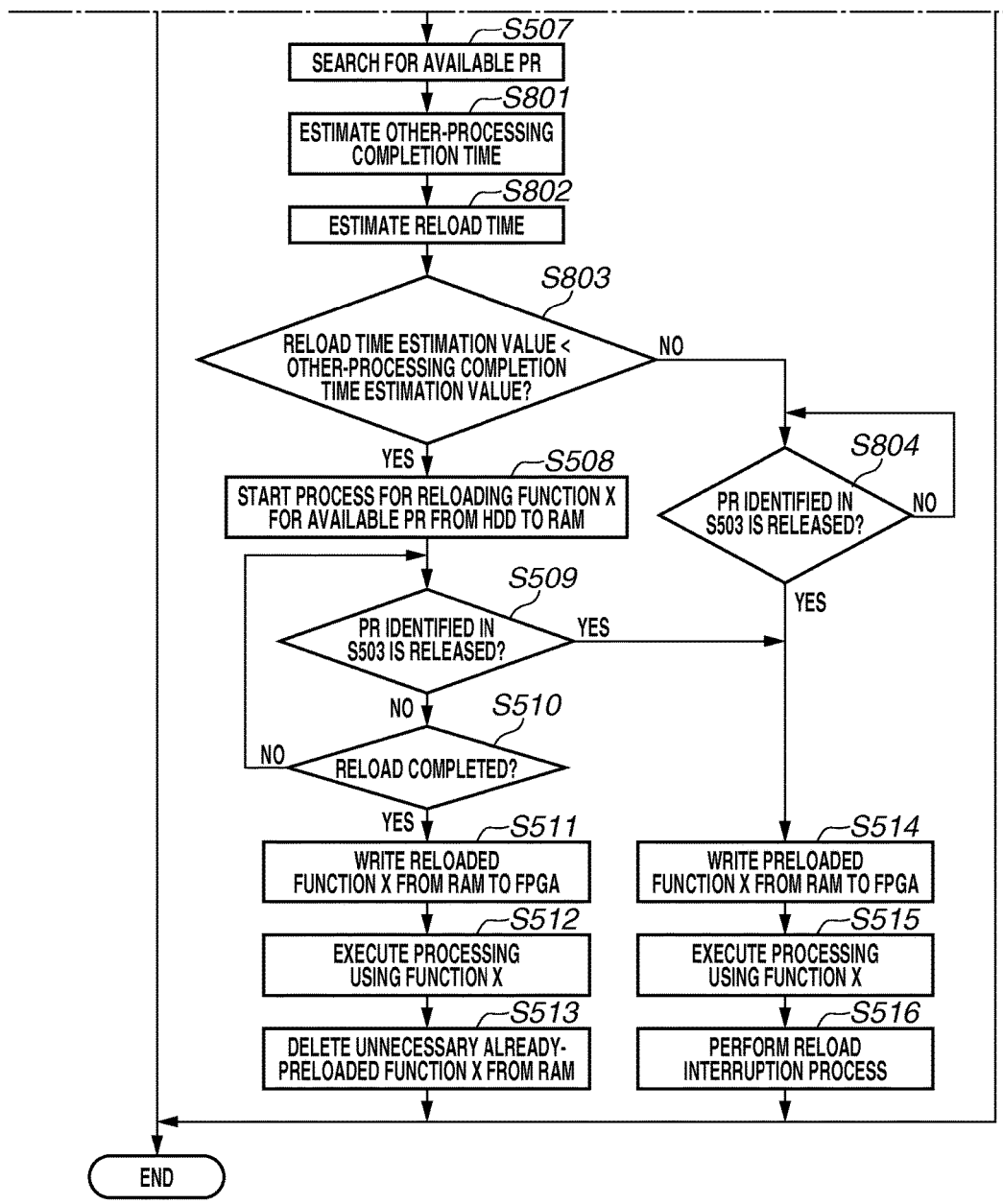

FIG. 8 (consisting of FIGS. 8A and 8B) is a flowchart illustrating a function execution control flow using a time estimation value of the image processing apparatus according to the present exemplary embodiment. The CPU 101 executes each procedure in the flowchart of FIG. 8. This control flow is obtained by adding steps S801, S802, S803, and S804 to the control flow in FIG. 5 of the first exemplary embodiment, using the time estimation value. For all the other parts, this control flow is identical to the control flow in FIG. 5. In step S801, an estimation value (other-processing completion time estimation value) of a time to completion of the other processing is determined using the partial reconfiguration portion management table 701, for the PR identified in step S503. In step S802, an estimation value (a transfer time estimation value) of a time to be taken for reloading the function X into the PR identified in step S503 is determined using the reload time estimation table 702. In step S803, the estimation value determined in step S801 and the estimation value determined in step S802 are compared with each other to determine which one of the reload and the other processing currently being executed is to be completed earlier. If the reload is estimated to be completed before the completion of the other processing (YES in step S803), the operation proceeds to step S508. Processing performed in step S508 and subsequent steps are similar to the corresponding processes in the flow of FIG. 5. If the reload is estimated to be completed after the completion of the other processing (NO in step S803), the operation proceeds to step S804. In step S804, a wait process is performed until the PR identified in step S503 is released. If the PR is released (YES in step S804), the operation proceeds to step S514. Processing performed in step S514 and subsequent steps are similar to the corresponding processes in the flow of FIG. 5.

By performing the above-described control, it is possible to reduce efficiency degradation as much as possible while suppressing a load on the CPU 101, even if a preload miss-hit occurs, in an image processing apparatus capable of performing dynamic partial reconfiguration. Performing the control according to the second exemplary embodiment can suppress the load on the CPU 101 as compared with the control described in FIG. 5, so that unnecessary reload processes can be reduced.

According to the above-described exemplary embodiments, in an image processing apparatus capable of performing dynamic partial reconfiguration, if a reconfigurable circuit is used while being partially reconfigured, control for suppressing efficiency degradation as much as possible can be executed at occurrence of a miss-hit of circuit configuration information transferred to a circuit information holding unit.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-241316, filed Nov. 28, 2014, which is hereby incorporated by reference herein in its entirety.

What is claimed is:

1. An information processing apparatus comprising:
a dynamically partially reconfigurable device including a plurality of partial reconfiguration portions;

a first storage unit configured to store a plurality of pieces of circuit configuration information corresponding respectively to the plurality of partial reconfiguration portions, wherein each of the plurality of pieces of circuit configuration information is used for configuring a corresponding one of the plurality of partial reconfiguration portions into an identical logic circuit providing a predetermined function;

a preload unit configured to preload, before receiving a request for executing the predetermined function, one of the plurality of pieces of circuit configuration information from the first storage unit into a second storage unit having an access speed higher than an access speed of the first storage unit; and a control unit configured to if the partial reconfiguration portion corresponding to the preloaded one of the plurality of pieces of circuit configuration information is currently used by executing a different function that is not the predetermined function when the request for executing the predetermined function is received, start loading, among the plurality of pieces of circuit configuration information, another one that corresponds to another partial reconfiguration portion that is available, in a state in which the preloaded one of the plurality of pieces of circuit configuration information remains stored in the second storage unit, and if the loading of the another one of the plurality of pieces of circuit configuration information completes before a completion of executing the different function using the partial reconfiguration portion, configure the another partial reconfiguration portion into the logic circuit by using the another one of the plurality of pieces of circuit configuration information stored into the second storage unit by the loading, without using the preloaded one of the plurality of pieces of circuit configuration information, wherein the predetermined function is executed by using the logic circuit into which the another partial reconfiguration portion is configured.

2. The information processing apparatus according to claim 1, wherein the plurality of pieces of circuit configuration information stored in the first storage unit are distinct pieces of circuit configuration information to be used to configure logic circuits having identical functions, in the respective pieces of plurality of partial reconfiguration portions.

3. The information processing apparatus according to claim 1, wherein the dynamically partially reconfigurable device is a field programmable gate array capable of being partially reconfigured, wherein the first storage unit is a hard disk drive, and wherein the second storage unit is a random access memory.

4. A control method for controlling an information processing apparatus including a dynamically partially reconfigurable device including a plurality of partial reconfiguration portions, a first storage unit configured to store a plurality of pieces of circuit configuration information corresponding respectively to the plurality of partial reconfiguration portions, wherein each of the plurality of pieces of circuit configuration information is used for configuring a corresponding one of the plurality of partial reconfiguration portions into an identical logic circuit providing a predetermined function, and a second storage unit having an access speed higher than an access speed of the first storage unit, the control method comprising:

preloading, before receiving a request for executing the predetermined function, one of the plurality of pieces of circuit configuration information from the first storage unit into the second storage unit; and performing control to if the partial reconfiguration portion corresponding to the preloaded one of the plurality of pieces of circuit configuration information is currently used by executing a different function that is not the predetermined function when the request for executing the predetermined function is received, start loading, among the plurality of pieces of circuit configuration information, another one that corresponds to another partial reconfiguration portion that is available, in a state in which the preloaded one of the plurality of pieces of circuit configuration information remains stored in the second storage unit, and if the loading of the another one of the plurality of pieces of circuit configuration information completes before a completion of executing the different function using the partial reconfiguration portion, configure the another partial reconfiguration portion into the logic circuit by using the another one of the plurality of pieces of circuit configuration information stored into the second storage unit by the loading, without using the preloaded one of the plurality of pieces of circuit configuration information, wherein the predetermined function is executed by using the logic circuit into which the another partial reconfiguration portion is configured.

5. The control method according to claim 4, wherein the plurality of pieces of circuit configuration information stored in the first storage unit are distinct pieces of circuit configuration information to be used to configure logic circuits having identical functions in the respective pieces of plurality of partial reconfiguration portions.

6. The control method according to claim 4, wherein the dynamically partially reconfigurable device is a field programmable gate array capable of being partially reconfigured, wherein the first storage unit is a hard disk drive, and wherein the second storage unit is a random access memory.

7. An information processing apparatus executing processing by using a logic circuit formed on a programmable logic circuit, comprising:

a first storage configured to store first circuit configuration information and second circuit configuration information, the first circuit configuration information being information for configuring a first partial region in the programmable logic circuit into a first logic circuit, the second circuit configuration information being information for configuring a second partial region in the programmable logic circuit into a second logic circuit, and the first logic circuit and the second logic circuit being identical to each other and being used for executing a predetermined function;

a second storage configured to hold the first circuit configuration information read out of the first storage before receiving a request for execution of the predetermined function, an access speed of the second storage being higher than an access speed of the first storage; and a controller including a processor, wherein the controller is capable of performing operation of;

causing the program logic circuit to configure the first partial region into the first logic circuit in accordance with the first circuit configuration information preloaded into the second storage in order to configure the first partial region into the first logic circuit and execute the predetermined function, on a basis of receiving the request for execution of the predetermined function, and causing the program logic circuit to configure the second partial region into the second logic circuit in accordance with the second circuit configuration information stored in the first storage, not the first circuit configuration information preloaded into the second storage, in order to configure the second partial region into the second logic circuit and execute the predetermined function, on a basis of receiving the request for execution of the predetermined function, before completion of another processing using the first partial region in a state in which the first circuit configuration information has been loaded into the second storage.

8. The information processing apparatus according to claim 7, wherein the controller is configured to, in a state in which the first circuit configuration information has been loaded into the second storage and in which the first partial region is used for executing a different function that is not the predetermined function, on a basis of receiving the request for execution of the predetermined function, start loading, into the second storage, the second circuit configuration information stored in the first storage, and cause the program logic circuit to configure the second partial region into the second logic circuit in accordance with the second circuit configuration information loaded into the second storage in order to configure the second partial region into the second logic circuit and execute the predetermined function in a case where the loading of the second circuit configuration information into the second storage completes before an end of execution of the different function.

9. The information processing apparatus according to claim 8, wherein, in a case where execution of the different function completes before completion of the loading of the second circuit configuration information into the second storage, the controller stops the loading, and causes the program logic circuit to configure the first partial region into the first logic circuit in accordance with the first circuit configuration information having been loaded in advance into the second storage in order to configure the first partial region into the first logic circuit and execute the predetermined function.

10. The information processing apparatus according to claim 7, wherein the second circuit configuration information has not been loaded into the second storage when the request for execution of the predetermined function is received.

11. The information processing apparatus according to claim 7, wherein the access speed of the storage is a speed of reading data out of the storage.

* * * * *